United States Patent
Roeckner et al.

[19]

[11] Patent Number: 5,995,033
[45] Date of Patent: Nov. 30, 1999

[54] SIGNAL CONDITIONING CIRCUIT INCLUDING A COMBINED ADC/DAC, SENSOR SYSTEM, AND METHOD THEREFOR

[75] Inventors: William Roeckner, Carpentersville; Neal Hollenbeck, Orland Park, both of Ill.; Timothy Rueger, Austin, Tex.; Walter Czarnocki, Hoffman Estates, Ill.

[73] Assignee: Motorola Inc., Schaumburg, Ill.

[21] Appl. No.: 09/017,617

[22] Filed: Feb. 2, 1998

[51] Int. Cl.⁶ .............. H03M 1/12; H03M 1/10; H03M 1/06; H03M 1/02

[52] U.S. Cl. .......... 341/155; 341/108; 341/110; 341/118; 341/120; 341/155

[58] Field of Search .................. 341/108, 110, 341/118, 120, 155

[56] References Cited

U.S. PATENT DOCUMENTS

| | | | |
|---|---|---|---|
| 3,883,864 | 5/1975 | Thomas | 341/110 |
| 4,308,585 | 12/1981 | Jordan | 364/520 |
| 4,445,111 | 4/1984 | Swift et al. | 341/120 |
| 4,622,536 | 11/1986 | Shih et al. | 341/144 |
| 4,636,964 | 1/1987 | Jacobs et al. | 364/483 |
| 4,973,976 | 11/1990 | Lee et al. | 341/141 |
| 5,404,141 | 4/1995 | Ohara | 341/110 |

*Primary Examiner*—Michael Tokar
*Assistant Examiner*—James H. Cho
*Attorney, Agent, or Firm*—Gary J. Cunningham

[57] ABSTRACT

An electronically calibrated sensor (100) includes a sensing element (102) with an output coupled to a signal conditioning circuit (104). The signal conditioning circuit (104) is adapted to be highly computationally efficient and operable for compensating for temperature and part-to-part variation on the sensing element output for providing a useable sensor output signal. The signal conditioning circuit (104) includes an analog-to-digital/digital-to-analog (ADC/DAC) conversion device (112). The ADC/DAC (112) is operable to perform both analog input signal analog-to-digital conversion and digital output signal digital-to-analog conversion. The ADC/DAC (112) is further adapted to provide analog control signals to input signal conditioning circuits (104, 106).

34 Claims, 7 Drawing Sheets

SIGNAL CONDITIONING CIRCUIT INCLUDING A COMBINED ADC/DAC, SENSOR SYSTEM, AND METHOD THEREFOR

FIELD OF THE INVENTION

The present invention relates generally to sensors and circuitry for conditioning sensor signals, and more particularly, to a signal conditioning circuit for a sensor having a combined analog-to-digital converter/digital-to-analog converter (ADC/DAC) device.

BACKGROUND OF THE INVENTION

The world is full of sensor devices for detecting physical phenomena and for providing a signal in response to the phenomena. For example, a thermometer converts the physical condition temperature into a visual signal, a height of mercury in a glass column. Another example of a temperature-sensing device is a thermocouple which converts the physical condition temperature into an electrical signal. To be useful the sensor signal has to be understood to correspond with a particular physical phenomenon. For example, the thermometer has lines on the glass column to indicate the degrees of temperature. The lines, of course, have to be in the right locations on the glass column to have meaning, and the process by which the lines are properly located is known as calibration. During calibration the sensor is subjected to a known physical condition or conditions and its response is observed. Observing the response of the sensor to the known conditions allows one to predict the sensor response for a wide range of conditions.

Pressure sensors are devices that provide a signal indicative of pressure, for example, the amount of air pressure within a tire. As with other types of sensors, pressure sensors require calibration to be useful. A specific kind of pressure sensor known as a piezoresistive pressure sensor provides a voltage signal indicative of pressure. The piezoresistive pressure sensor poses a number of problems in application. For example, the piezoresistive sensing element provides a relatively low level voltage signal. In addition, the piezoresistive sensing element may provide a signal that is sensitive to changing temperature and that does not change linearly with changing pressure. Moreover, the signal voltage characteristic from one sensing element to another sensing element may not be consistent. Therefore, special signal conditioning circuitry is required for a sensor product that provides a high level sensor output that is sufficiently accurate across a wide range of operating temperatures and pressures. Importantly, the device has to be capable of mass production, at low cost and with a high degree of part-to-part repeatability.

Most low cost signal conditioning approaches use analog circuits that are adjusted during a calibration process. For example, it is known to use amplifier circuits coupled to resistor networks. In one such application, the resistor network includes a number of resistive elements coupled by fusible links. Though limited in the degree of adjustment available, various resistive values may be established for providing an acceptable output from the amplifier network. In another application, the resistor network includes laser trimmable resistive elements. During a calibration process, the resistive elements are trimmed using a laser to achieve the correct resistive values to provide an acceptable output from the amplifier network. In either application access to the circuit may be required during processing in order to fuse links and/or laser trim components. Hence manufacturing processing options are limited. Also, in certain applications offset, sensitivity and linearity may be difficult to compensate for independently. Furthermore, processing activities following calibration may introduce error that can not be corrected in the final product. And, the laser trim process requires expensive processing hardware and suffers increased cycle time.

An alternative design provides for electronic calibration of the sensing element. Sensors adapted for electronic calibration have included a microprocessor coupled to the sensor element via suitable signal conditioning circuitry and to a memory in which a calibration method is retained. During processing, the sensing element is tested under various known-operating conditions. Calibration values are established and stored in the memory. In operation, the microprocessor in conjunction with the method and calibration values operates to provide a sensor output. Other implementations use digital signal processors (DSPs) to perform the required calculations on digitized values of the sensor element output.

Systems implemented using digital technology generally consist of 1) front-end analog signal conditioning, 2) analog-to-digital conversion, 3) digital processing, 4) digital-to-analog conversion and 5) back-end analog signal output drive. The front-end conditioning often consists of digitally programmable gain and offset functions, in which the offset signal is usually generated by some form of digital-to-analog converter (DAC). If the signal conditioning circuit also includes some form of disturbance variable compensation, the disturbance variable signal is also front-end conditioned and digitized.

It is possible, then, that the sensor signal conditioning circuit may require at least two analog-to-digital converters (ADCs). One to digitize the sensing element output and one to digitize the disturbance variable signal. Front-end signal conditioning of the sensing element output and disturbance variable may require DAC devices to provide the appropriate control signal to the conditioning circuits. Also, the digitized corrected sensor output requires conversion back to analog. Thus, the signal conditioning circuit may require two ADCs and as many as three DACs. These devices are die area intensive in integrated circuit implementations, particularly in that the accuracy of ADCs and DACs is directly related to the physical size of the matching components (capacitors, resistors, transistors, etc.) used to make up the devices. The substantial amount of die area required to implement the several analog-to-digital and digital-to-analog operations has hampered the use of digital technology in sensor signal conditioning applications.

The typical successive approximation implementation of an ADC includes at least one DAC. It has been recognized in the art that where both analog-to-digital and digital-to-analog conversion (A/D and D/A, respectively) are required it may be possible to reuse the DAC in the ADC device. Examples of this architecture fail to address circuit implementations requiring numerous A/D and D/A conversion operations such as required in the sensors signal conditioning circuit, which includes several D/A outputs and several A/D inputs.

Therefore, there remains a need for an electronically calibrated sensing device using digital signal processing that makes efficient use of ADC and DAC devices so as to minimize the number of such devices in the signal conditioning circuit. The sensing device preferably includes a signal processing circuit that provides for digital calibration of the sensor and its analog input conditioning circuits. Essentially, a more silicon efficient and accurate approach is needed.

DETAILED DESCRIPTION OF THE PREFERRED EMBODIMENTS

In an electronically calibrated sensor a sensing element provides a sensing element output signal coupled to a calibration circuit. The calibration circuit is adapted to be highly computationally efficient and operable for temperature variation compensation, part-to-part variation compensation, linearizing and scaling of the sensing element output for providing a useable sensor output signal. The calibration method includes a highly efficient ADC/DAC implementation having substantial component reuse. It will be appreciated that the calibration circuit and ADC/DAC device have application to any sensor type.

Figure 1:
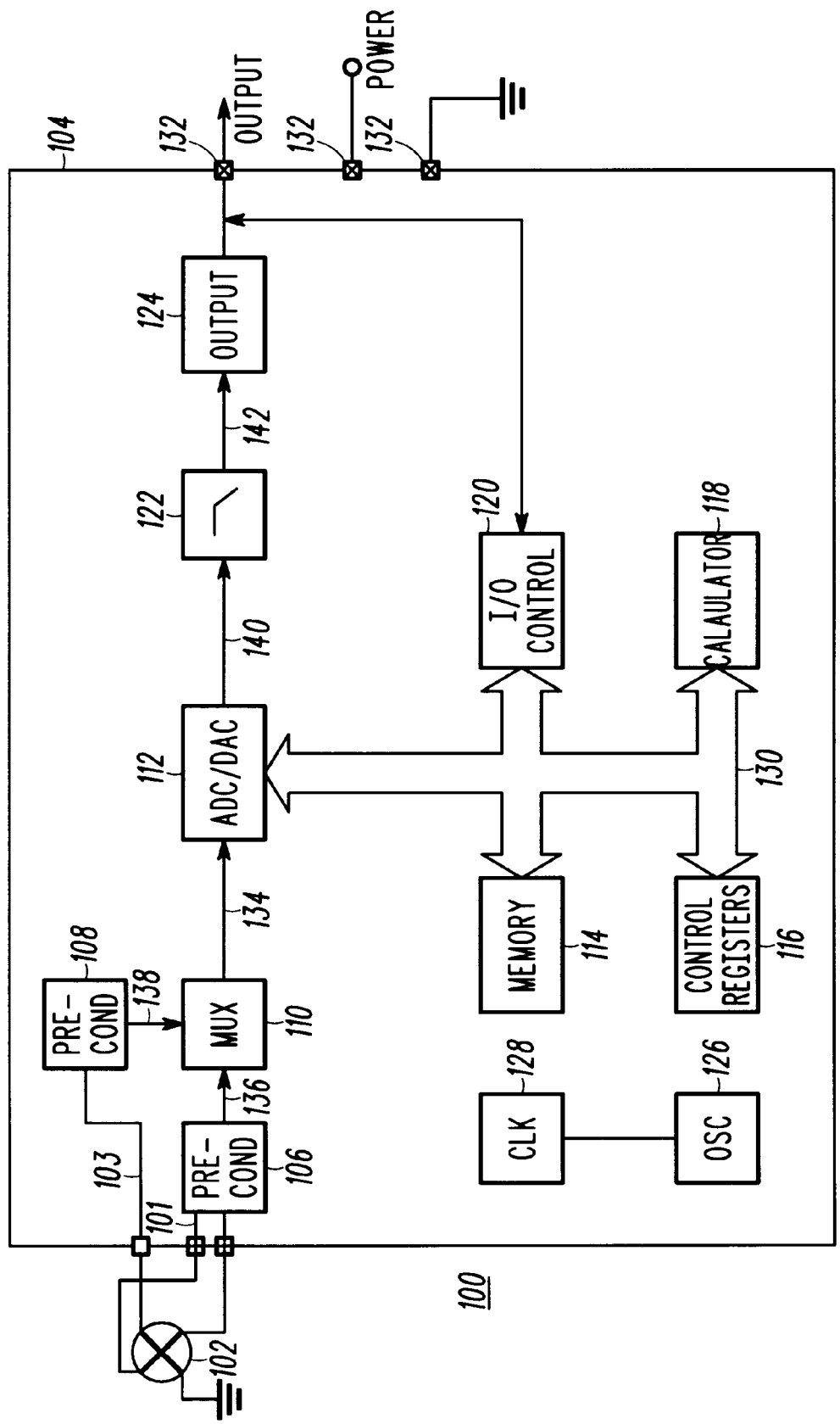
FIG. 1 is a block diagram illustrating a sensor system including a signal conditioning circuit in accordance with a preferred embodiment of the present invention.

With reference then to FIG. 1, a sensor 100 includes a sensing element 102 coupled to, and providing a pressure sensor signal 101 to a signal conditioning circuit 104. Signal conditioning circuit 104 is preferably implemented as a single chip, integrated circuit and includes pressure signal preconditioning circuitry 106, temperature signal preconditioning circuit 108, multiplexer 110, analog-to-digital/digital-to-analog converter (ADC/DAC) 112, electronically erasable programmable read only memory (EEPROM) 114, control memory registers 116, polynomial calculator 118, input/output (I/O) controller 120, output filter 122 and output driver 124. Circuit 104 further includes an oscillator 126 coupled to a clock generator 128 having an output suitably coupled to the foregoing circuit elements as is known in the art. Furthermore, one of ordinary skill in the art will appreciate that in accordance with sound design practice circuit 104 will further include over-voltage protection, an operating voltage generator, power-on-reset function, and test logic (not shown).

Sensing element 102 is preferably a piezoresistive sensing element formed as a portion of a semiconductor die as is known in the art for providing a pressure indicative signal. In preferred implementations, sensing element 102 may be formed as a separate element and coupled to signal conditioning circuit 104 (as shown in FIG. 1) or may be formed integral as part of a processing circuit chip. Sensing element 102 further provides a temperature signal 103. In an alternate preferred embodiment, a separate temperature sensing device may be included to provide the temperature signal. The signals 101 and 103 output from the sensing element 102 are relatively low-level signals that generally vary with temperature and are subject to substantial variation from part-to-part. The output signals 101 and 103 of sensing element 102 may also include certain non-linear properties. Accordingly, the output signals of sensing element 102 are operated upon by signal conditioning circuit 104 for providing a temperature compensated substantially linear signal in a usable voltage range.

More specifically, the pressure and temperature output signals 101 and 103 of sensing element 102 are coupled to pressure and temperature preconditioning circuitry 106 and 108, respectively, for initially filtering, amplifying and applying an offset to the sensing element 102 output signals. The pre-conditioned pressure and temperature signals are then selectively coupled via multiplexer 110 to ADC/DAC 112. ADC/DAC 112 operates on the pre-conditioned signals for providing, respectively, digital pressure and temperature signals.

From ADC/DAC 112, the digital pressure and temperature signals are coupled via bus 130 to control registers 116 and polynomial calculator 118. EEPROM 114 includes a data storage portion and more particularly storage for a plurality of calibration data for use by polynomial calculator 118 in providing a compensated pressure sensor signal. Output signals from polynomial calculator 118 are coupled via bus 130 to ADC/DAC 112 where the digital output signal is converted back to an analog output signal. The analog output signal is filtered using filter 122 and amplified for output by output driver 124. I/O control device 120 provides an ability to access and operate upon, such as writing to EEPROM 114, from external to sensor 100 while utilizing a minimum number of pins 132.

A preferred construction of ADC/DAC 112 is described and its operation detailed with reference to the embodiment of a sensing element signal conditioning circuit 200 shown in FIG. 2. Signal conditioning circuit 200 includes, in addition to ADC/DAC 112, digitally compensated analog input circuit, or analog signal conditioning circuit 202, digital signal processing circuit 204, analog output driver circuit 206 and memory device 208 having an output bus 231. In comparison to elements shown in FIG. 1, circuit element 202 may be considered analogous to preconditioning element 106 or preconditioning element 108. Similarly, circuit element 206 may be considered analogous to output filter 122 and output driver 124, and circuit 204 may be considered analogous to polynomial calculator 118, and circuit element 208 may be considered analogous to memory 114.

Digitally compensated analog input, or signal conditioning, circuit 202, is essentially an amplifier that includes an analog signal input terminal 217, a compensation signal sample/hold circuit 210, driver circuit 214, a summing circuit 218, and an output terminal 219. A compensation signal, in the form of an analog offset signal, is periodically communicated from ADC/DAC 112 to sample/hold circuit 210, via an analog, or parameter, control input terminal 221. The offset signal is added to the input of driver circuit 214 via summing circuit 218 to provide an offset-corrected analog input signal as is known in the art. The analog offset value is determined during a calibration process for the sensor 100. Memory 208 includes a data structure into which a digital offset value is written during the calibration process. The digital offset value, provided via the output bus 231, when converted to an analog offset value signal by ADC/DAC 112, provides an appropriate analog offset value for use by the driver circuit 214. As will be explained later, ADC/DAC 112 periodically retrieves the digital offset value, converts the digital offset value to the analog offset value signal and communicates it to analog input circuit 202, via the analog control input terminal 221. Operating parameters, other than offset, can also be stored in the data structure of the memory 208, converted and sent to modify operation of the analog input circuit 202. Other parameters may include gain, linearity, temperature, or other compensating parameters.

The output of analog input circuit 202, an analog signal, is communicated to ADC/DAC 112 via the output terminal 219. The ADC/DAC 112 converts the analog signal to a digital input value, or digital successive approximation data. The digital input value is then communicated to signal processing circuit, or DSP, 204 which operates on the digital input value and then provides a digital output value dependent thereon. The digital output value is then communicated back to ADC/DAC 112, which operates to convert the digital output value to the analog output signal. The analog output signal is accordingly communicated to analog output circuit 206.

Figure 2:
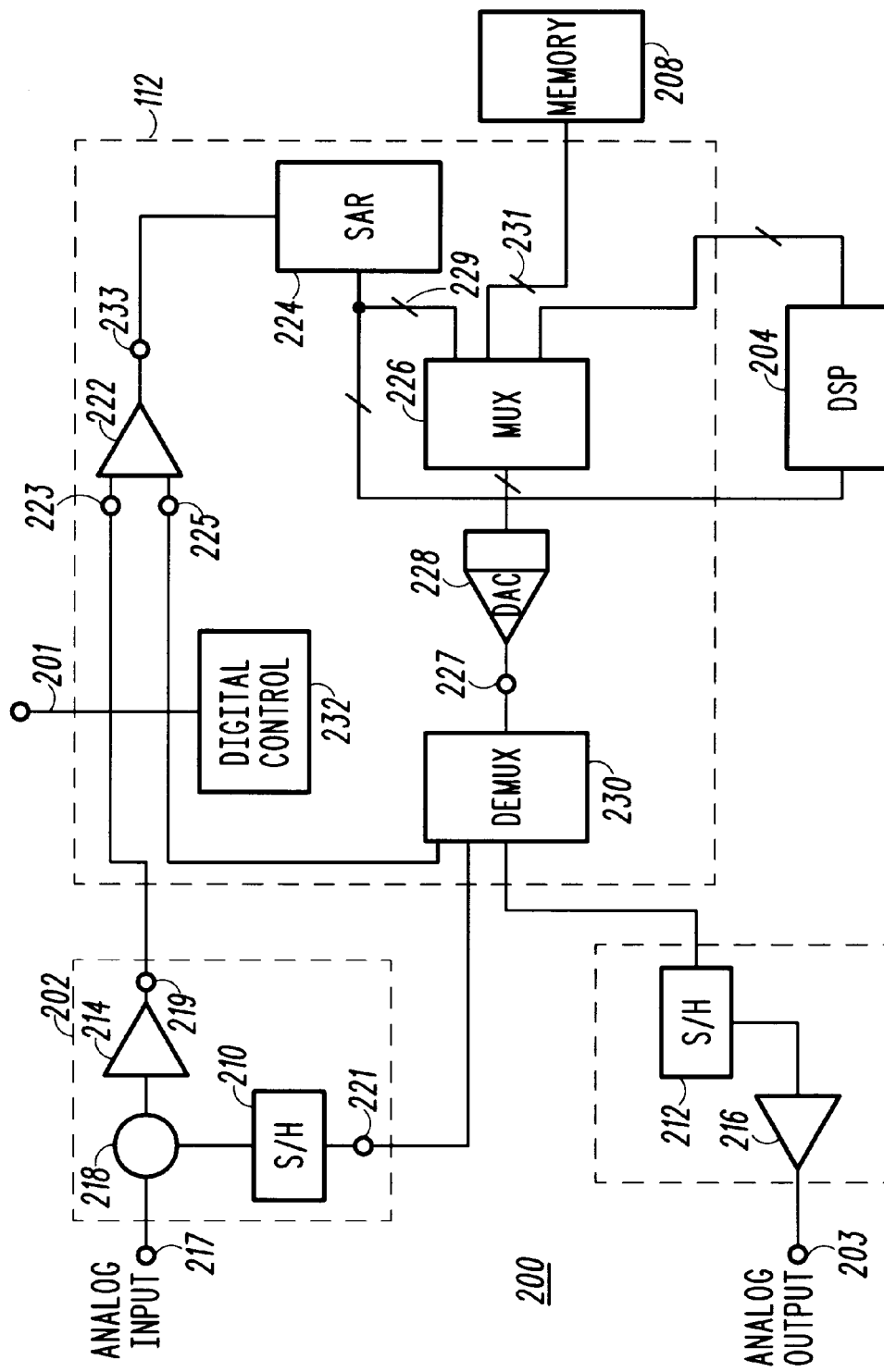
FIG. 2 is a block diagram illustration of an ADC/DAC device in accordance with a preferred embodiment of the present invention.

With continued reference to FIG. 2, ADC/DAC 112 includes comparator 222, successive approximation register (SAR) 224, multiplexer 226, digital-to-analog converter (DAC) 228 and demultiplexer 230. ADC/DAC 112 further includes digital control element 232 operatively coupled to comparator 222, successive approximation register 224, multiplexer 226, digital-to-analog converter (DAC) 228 and demultiplexer 230 for providing suitable control of the ADC/DAC 112 in its several modes of operation. The digital control element 232 can be controlled and pass data over a control bus 201, through the I/O control device 120.

In a first mode of operation, ADC/DAC 112 operates as an analog-to-digital conversion device. That is, multiplexer 226 and demultiplexer 230 are configured to couple an output port 229 of SAR 224 to the input of DAC 228. A first input terminal of the comparator 222 is coupled to the output terminal 219 of the analog input circuit 202, and a second input terminal of the comparator 222 is coupled to an analog output terminal 227 of the DAC 228. The comparator 222 also has an output terminal 233. In this configuration, comparator 222, SAR 224 and DAC 228 operate as a standard successive approximation type analog-to-digital conversion device. Control element 232 maintains this configuration until a successful conversion of the signal provided at output terminal 219 is completed. As is known in the art, successful conversion occurs where the output digital value from SAR 224, when converted to an analog signal, is sufficiently close in value to the analog input signal as determined by comparator 222. The digital word output of SAR 224 representative of the analog input is coupled to an input of DSP 204.

The output digital value from DSP 204 is communicated to multiplexer 226 and ADC/DAC 112 is configured for a second, output, mode of operation. That is, multiplexer 226 is configured to couple the output of DSP 204 to DAC 228. Demultiplexer 230 is configured to couple the output of DAC 228 to analog output circuit 206. DAC 228 converts the digital output value to an analog output value, which is then coupled to analog output circuit 206, and particularly to sample/hold circuit 212 thereof.

Figure 3:
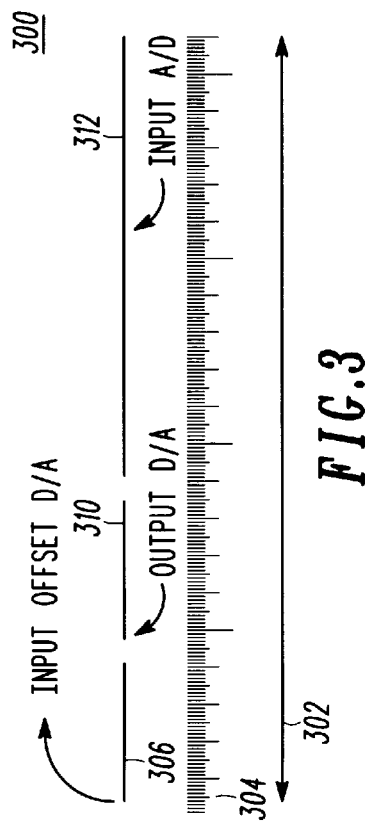
FIG. 3 is a timing diagram illustrating operation of the circuit of FIG.2.

In a third mode of operation of ADC/DAC 112, multiplexer 226 is configured to couple an output of memory 208 to DAC 228. Demultiplexer 230 is configured to couple the output of DAC 228 to analog input circuit 202, and particularly to sample/hold circuit 210 thereof. A digital offset value for analog input device 202 is read from memory 208. The digital offset value is converted to an analog input offset signal. The analog input offset signal is communicated to and retained in sample/hold circuit 210. During operation of circuit 200, periodic refreshing of the analog input offset is required. ADC/DAC 112 advantageously utilizes available processing time, i.e., time during which it is neither performing input signal analog-to-digital conversion nor output signal digital-to-analog conversion, to perform the offset signal refreshing process. FIG. 3 illustrates an exemplary timing arrangement 300 for ADC/DAC 112.

Referring to FIG. 3, during a total circuit cycle 302, the above described three modes of operation take place. Clock cycles, or other suitable timing units, are illustrated at 304. Input offset signal digital-to-analog conversion takes place at 306, and output signal digital-to-analog conversion takes place at 310. Each of these operations, essentially straight conversions of a digital value to an analog signal require approximately the same number of processing cycles. The input signal analog-to-digital conversion then takes place at 312. Following input signal analog-to-digital conversion 312 the cycle is repeated at input offset signal digital-to-analog conversion 306. In a preferred implementation of sensor 100, there are two analog inputs corresponding to pressure and temperature, respectively. It is thus appreciated that two analog offset signals and two input analog-to-digital conversions are required and the timing is suitably revised.

Figure 4:
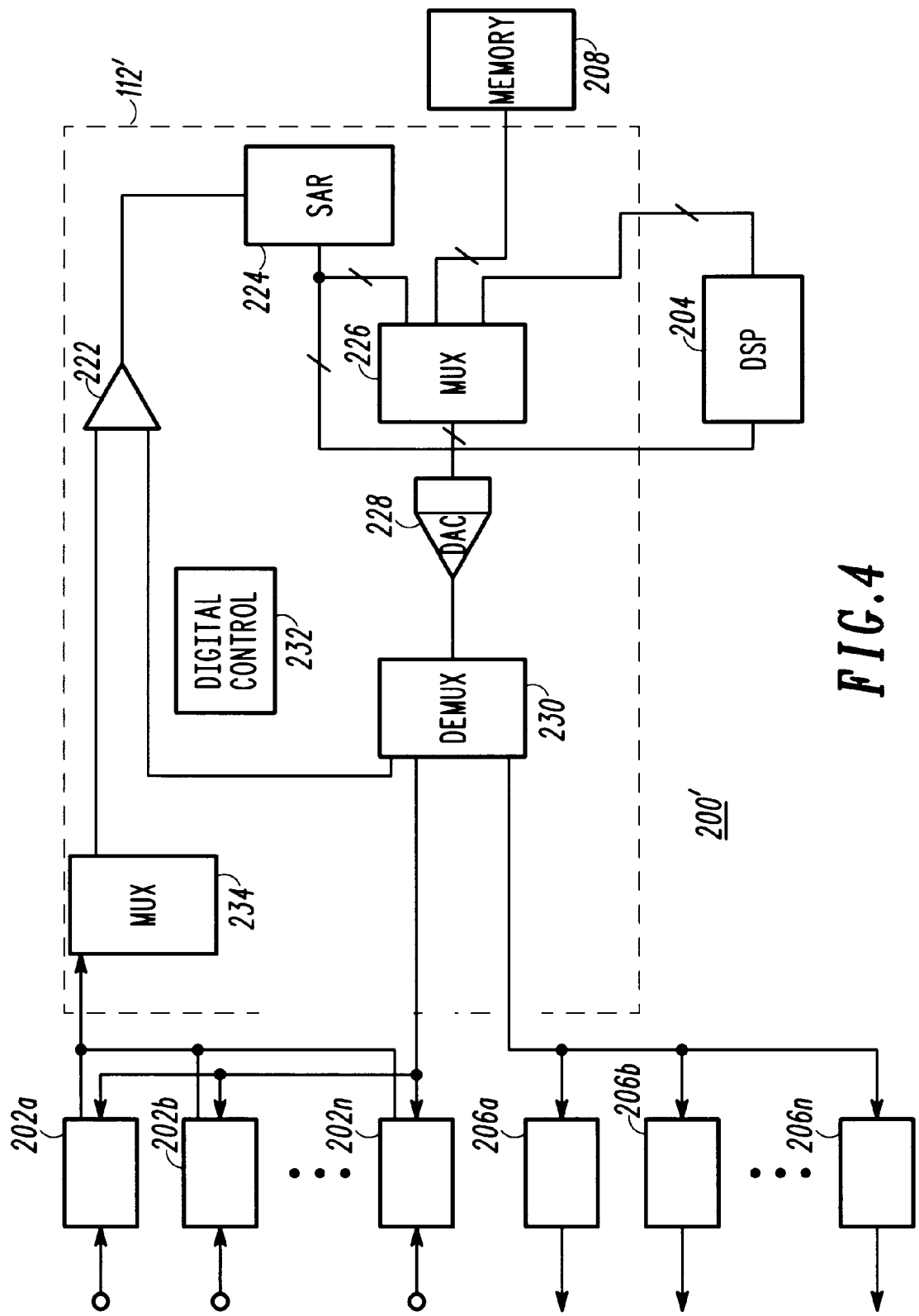
FIG. 4 is a block diagram illustration of an ADC/DAC device in accordance with another preferred embodiment of the present invention.

From the foregoing discussion ADC/DAC 112 is advantageously and efficiently utilized to provide each of the required analog-to-digital and digital-to-analog conversion operations with a minimal amount of circuitry. Addition of multiplexer 226 between SAR 224 and DAC 228 and demultiplexer 230 between DAC 228 and comparator 222 advantageously allows for reuse of an otherwise typical SAR ADC device for a plurality of operations. For example, a plurality of digital-to-analog conversion operations may be accomplished through coordinated coupling of the digital input to multiplexer 226 and the coordinated coupling of the analog output via demultiplexer 230. With reference to FIG. 4 an alternate preferred arrangement of circuit 200, circuit 200', is shown configured for multiple analog inputs, and accordingly, multiple analog-to-digital conversion operations.

Referring then to FIG. 4, circuit 200' includes ADC/DAC 112' shown adapted to receive a plurality of analog inputs from sensing element signal conditioning circuits 202a–202n. ADC/DAC 112' is essentially the same as ADC/DAC 112 except for the noted alterations for processing a plurality of signals. Like elements from circuit 200 are labeled with like reference numerals. Each of circuits 202a–202n are coupled to receive an analog input signal from a number of analog signal sources such as a number of sensing element devices. For example, sensor 100 has two sensor signal inputs, a first signal for temperature and a second signal for pressure. There are also shown a plurality of output signal circuits 206a, 206b . . . 206n coupled to ADC/DAC 112'. Moreover, output signals from each of circuits 202a–202n are coupled via multiplexer 234 for analog-to-digital conversion utilizing ADC/DAC 112' in an analog-to-digital conversion mode as previously described. Operation of ADC/DAC 112' is again controlled by digital control element 232 which respectively configures ADC/DAC 112' for analog-to-digital conversion and to communicate the resulting digital values to DSP 204. Digital output values from DSP 204 are then converted back to analog signals via multiplexer 226 and DAC 228. The analog output signals are then communicated to the respective output signal circuits 206a–206n via demultiplexer 230. Moreover, ADC/DAC 112' is further configurable to provide analog offset signals to circuits 202a–202n as previously described.

Figure 5:
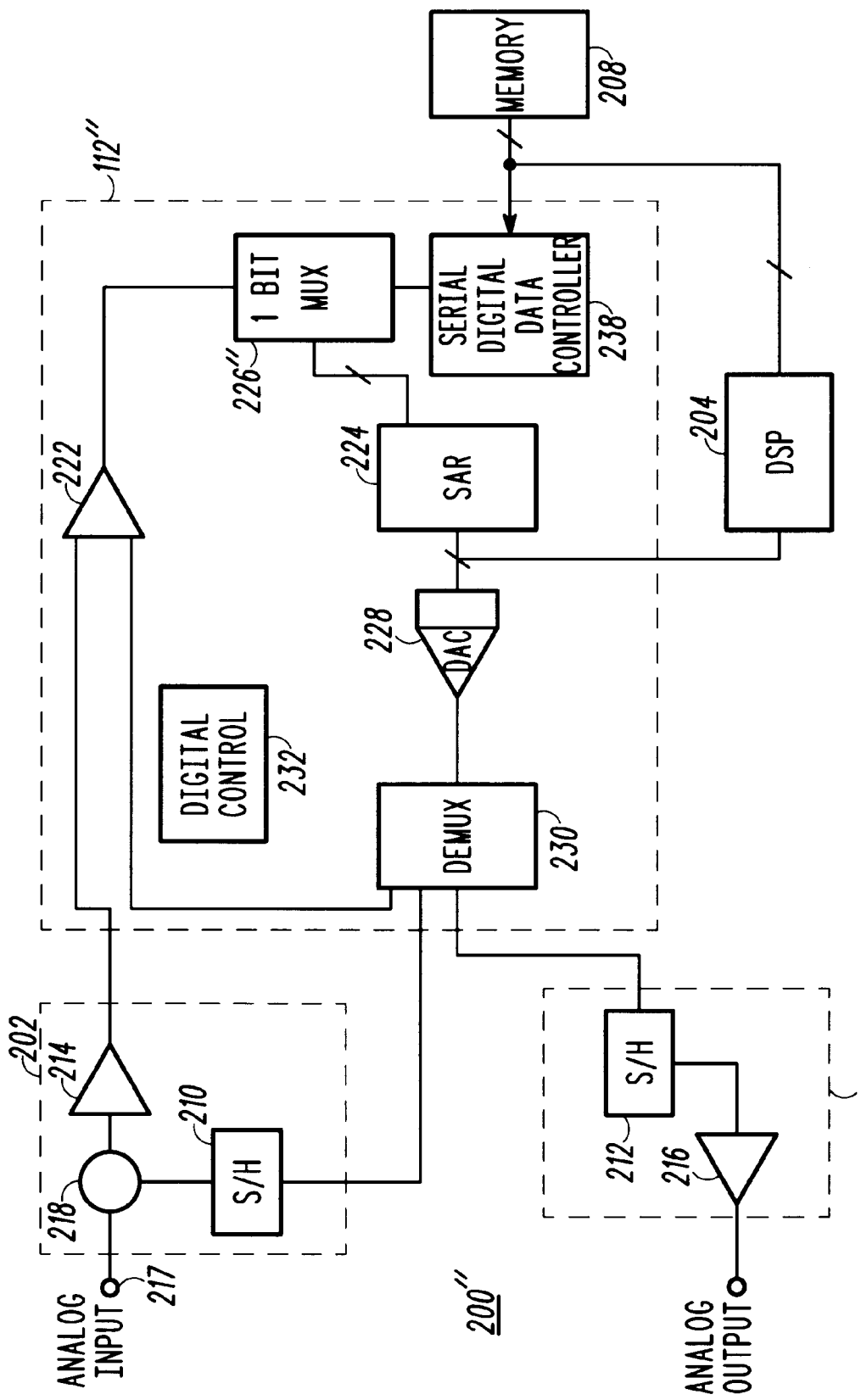
FIG. 5 is a block diagram illustration of an ADC/DAC device in accordance with another embodiment of the present invention.

Referring now to FIG. 5 another embodiment of circuit 200, circuit 200", is shown. Again, like reference numerals are used to refer to like elements from circuit 200. As seen in FIG. 5, ADC/DAC 112" is reconfigured with SAR 224 being relocated such that its output is now directly coupled to the input of DAC 228. Also, multiplexer 226" is reconfigured to receive an output from comparator 222 and also to receive serial digital data from serial digital data controller 238, which is essentially a parallel to serial converter. In all other aspects ADC/DAC 112" is the same as ADC/DAC 112. For analog-to-digital conversion operations, the output of comparator 222 is coupled via multiplexer 226" to SAR 224. The successful digital conversion of the analog signal is again coupled to an input of DSP 204. The digital output values from DSP 204, as well as the digital values from memory 208, are coupled via serial digital data controller 238. Serial digital data controller 238 receives parallel digital data from DSP 204 and memory 208 and provides a serial digital data stream to multiplexer 226". Multiplexer 226", in turn, couples the serial digital data to SAR 224.

Figure 6:
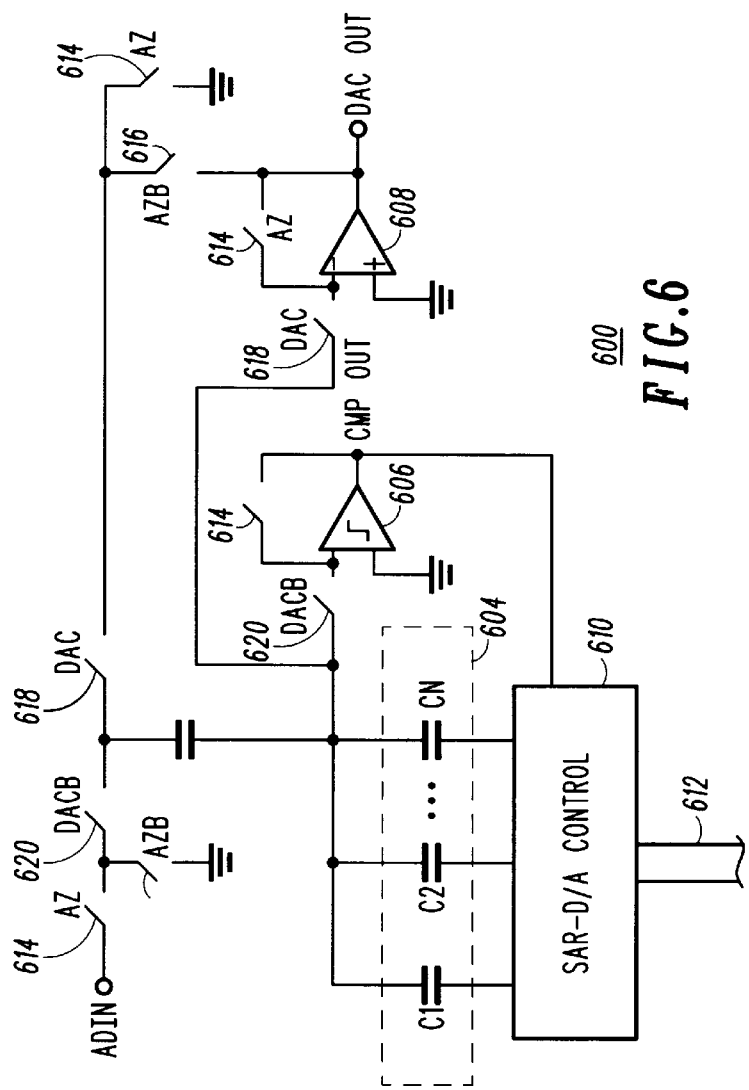
FIG. 6 is a circuit diagram of an ADC/DAC device in accordance with a preferred embodiment of the present invention

With reference to FIG. 6, a more detailed circuit 600 representation of ADC/DAC 112 is shown. In a preferred implementation, circuit 600 includes operatively coupled: an input capacitor array 602, a reference capacitor array 604, comparator 606, and an output amplifier 608. While shown in a single ended configuration for simplicity, one will appreciate that a differential implementation may be preferred in certain applications. Moreover, revising circuit 600 in a differential manner is well within the skill of one of ordinary skill in the art given FIG. 6 and the following description. Circuit 600 further includes a plurality of auto-zero/sample switches 614, valid output switches 616, digital-to-analog control switches 618 and analog-to-digital control switches 620 for controlling operation of circuit 600. In addition, and as will be explained, input capacitor array 602, while shown as a single capacitor in FIG. 6 is actually a capacitor array. Input capacitor array 602 is preferably a complimentary array to reference capacitor array 604, but of twice the value.

Figure 7:
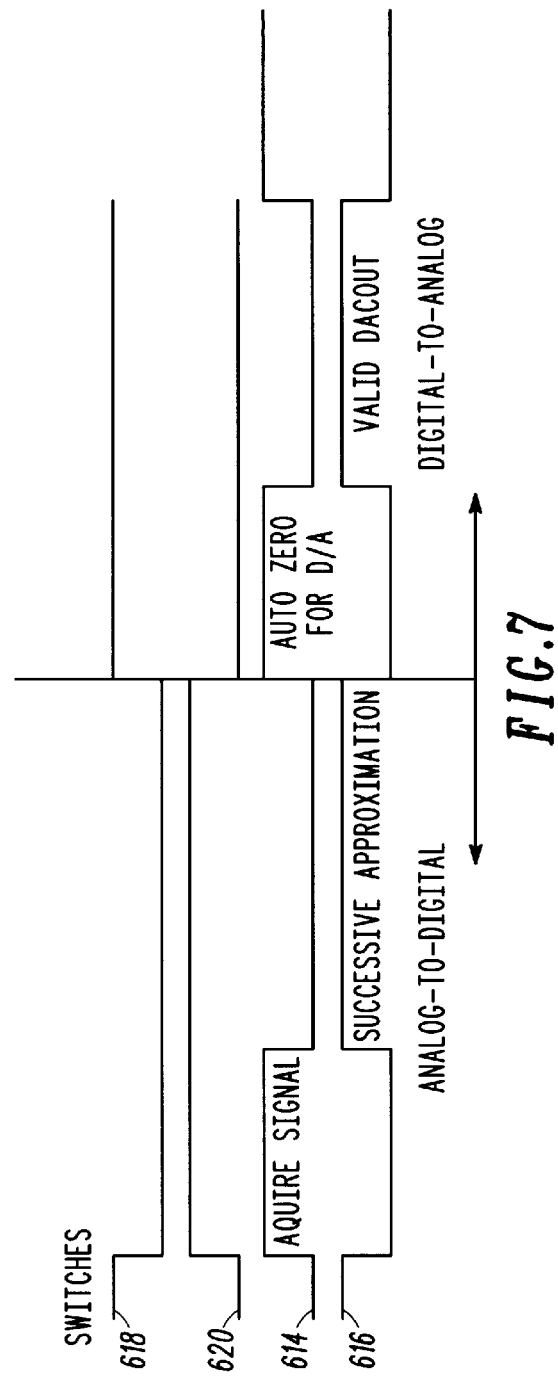
FIG. 7 is a timing diagram further illustrating operation of the ADC/DAC device of the present invention.

The preferred implementation of circuit 600 includes auto-zero/sample switches 614 and valid output switches 616 to cancel offset errors of the various elements that form circuit 600, and particularly, comparator 606 and output amplifier 608. The preferred operation of circuit 600, illustrated in the timing diagram of FIG. 7, has prior to each digital-to-analog and analog-to-digital conversion operation auto-zero/sample switches 614 closed and valid output switches 616 open. During either of the digital-to-analog and analog-to-digital operations, auto-zero/sample switches 614 are open and valid output switches 616 are closed. Still referring to FIG. 7, during analog-to-digital conversion analog-to-digital control switches 620 are closed and digital-to-analog control switches 618 are open. Similarly, during digital-to-analog conversion analog-to-digital control switches 620 are open while digital-to-analog control switches 618 are closed.

With the foregoing in mind and referring back to FIG. 6, during analog-to-digital conversion operations, the input analog value is read in and stored on input capacitor array 602. Successive approximation occurs under control of SAR-D/A control 610 to develop a charge on reference capacitor array 604 of equal magnitude to that on input capacitor array 602. When the charge magnitudes of each array become equal the successive approximation operation ends as is known in the art. The digital value corresponding to the analog input signal may then be read from the SAR-D/A control 610 and communicated via bus 612 to operations requiring the digital value. It should be appreciated that efficient control strategies are implemented in SAR-D/A control 610 to minimize conversion times and maximize conversion accuracy.

In a digital-to-analog conversion mode, the digital value is received via bus 612 and is read onto reference capacitor array 604, which acts as a binary weighted capacitor array. The charge on reference capacitor array 604 is transferred to input capacitor array 602 which is configured as a feedback capacitor across output amplifier 608 to form a switched-capacitor gain stage.

The error for the analog-to-digital conversion is a function of the matching of the reference capacitor array 604 to the input capacitor array 602. The error of the digital-to-analog conversion is a function of the feedback capacitor, namely input capacitor array 602, to the reference capacitor array 604. Utilizing the input capacitor array in a feedback function during digital-to-analog conversion operations, gain error may be minimized. Moreover, the auto-zeroing function operates to minimize offset error. Hence, it will be appreciated that circuit 600 provides efficient, configurable analog-to-digital and digital-to-analog conversion with minimized error. Next a preferred method of calibrating the sensor 100 will be detailed.

Figure 8:
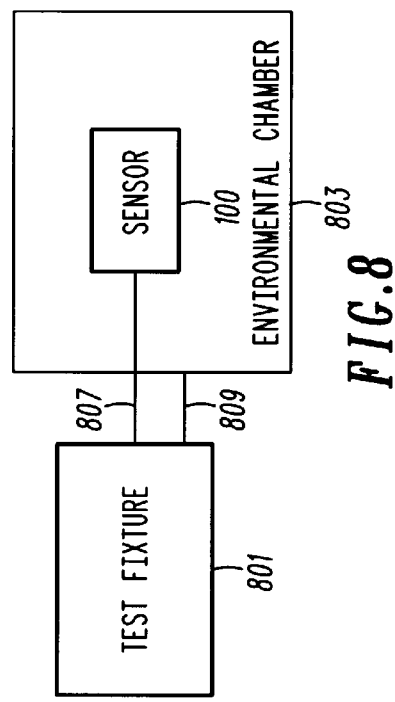
FIG. 8 is a schematic diagram of a test system used to calibrate the sensor in accordance with a preferred method.

The method for calibrating the sensor 100 relies on the earlier-described sensor structural mechanisms and a test system described in FIG. 8.

Figure 9:
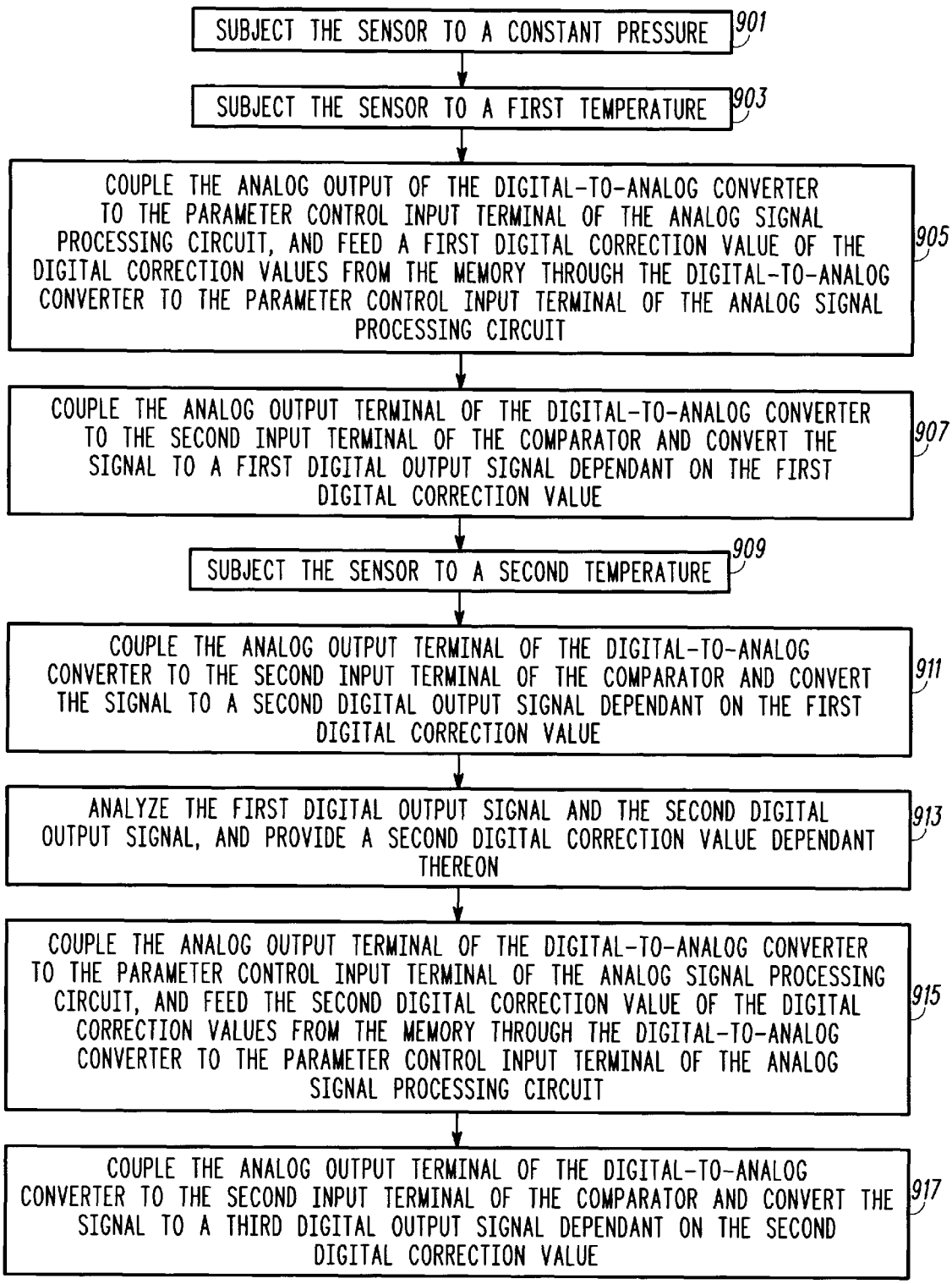
FIG. 9 is a flow chart illustrating the preferred method of calibrating the sensor.

FIG. 8 is a schematic diagram of a test system used to calibrate the sensor in accordance with a preferred method, and FIG. 9 is a flow chart illustrating the preferred method of calibrating the sensor. Both FIGS. 8 and 9 will be referred to in the following discussion.

Here, a method of calibrating the sensor's temperature performance will be detailed. Those skilled in the art will quickly realize that the described method can also be adapted to calibrate the sensor's offset, sensitivity and linearity, both for temperature and pressure performance.

First, in step 901 the sensor 100 is disposed into an environmental chamber 803. Operation of the environmental chamber 803 is controlled and monitored by a test fixture 801 via signals 809. The sensor is controlled and monitored by the test fixture 801 via signals 807. During this calibration example the pressure in the environmental chamber is held constant.

Next, in step 903 the sensor 100 is subjected to a first physical condition; in this case to a first temperature.

Then in step 905, the analog output terminal 227 of the digital-to-analog converter 228 is coupled to the parameter control input terminal 221 of the analog signal conditioning circuit 202 via the demultiplexer 230, and a first digital correction value, of digital correction values stored in the memory device 208, is routed from the memory device 208, via the multiplexer 226, through the digital-to-analog converter 228 to the parameter control input terminal 221 of the analog signal conditioning circuit 202. Referring back to FIG. 4 for a moment, the memory device 208 is configured to hold digital correction values associated with each of the circuits 202a–202n.

Returning to FIG. 9, in step 907 the analog output terminal 227 of the digital-to-analog converter 228 is coupled to the second input terminal 225 of the comparator 222 via the demultiplexer 230, and the output port 229 of the SAR 224 is coupled, via the multiplexer 226, to the DAC 228, configuring the ADC/DAC 112 as a successive approximation type analog-to-digital converter. The signal, provided from the analog signal conditioning circuit 202, is converted by the ADC/DAC 112 to a first digital output signal dependent on the first digital correction value. This first digital output signal may either be used by the DSP 204 or the test fixture 801, as described later.

Then, in step 909, under the control of the test fixture 801, the environmental chamber 803 is commanded to subject the sensor 101 to a second physical condition; in this example a second temperature.

Next, in step 911 the analog output terminal 227 of the digital-to-analog converter 228 is coupled, via the demultiplexer 230, to the second input terminal 225 of the comparator 222, and the signal provided from the analog signal conditioning circuit 202 is converted by the ADC/DAC 112 to a second digital output signal dependent on the first digital correction value.

In step 913, the first digital output signal and the second digital output signal are analyzed, either by the test fixture 801, or by the DSP 204 under the control of the test fixture 801, via signals 807 communicated to the digital control element 232 over the control bus 201, and a second digital correction value is provided dependent thereon. This second digital correction value is then stored in the memory 208. Once the second digital correction value is derived, the analog signal conditioning circuit 202 can be permanently trimmed or calibrated.

Then, in step 915 the analog output terminal 227 of the digital-to-analog converter 228 is coupled, via demultiplexer 230, to the parameter control input terminal 221 of the analog signal conditioning circuit 202. Then, the second digital correction value of the digital correction values is fed from the memory device 208 through the digital-to-analog converter 228 to the parameter control input terminal 221 of the analog signal conditioning circuit 202. The analog signal conditioning circuit 202 is now calibrated and will now be used to properly convert a sensing element signal to a digital representation of itself.

In step 917 the analog output terminal 227 of the digital-to-analog converter 228 is coupled to the second input terminal 225 of the comparator 222 using the demultiplexer 230, and the ADC/DAC 112 is once again configured as a successive approximation type analog-to-digital converter. The signal provided from the analog signal conditioning circuit 202 is converted by the ADC/DAC 112 to a third digital output signal dependent on the second digital correction value. Once the third digital output signal is available it can be processed by the DSP 204 into a fourth, temperature compensated, digital signal. Then, the DSP 204 is coupled via multiplexer 226 to the digital-to-analog converter 228, and the analog output terminal 227 of the digital-to-analog converter 228 is coupled via demultiplexer 230 to the analog output circuit 206. In this configuration the ADC/DAC 112 is arranged as a DAC and converts the fourth digital signal to a conditioned (and calibrated) sensor signal at the analog output terminal 203. This signal, available at the analog output terminal 203 is coupled to pins 132 so that the conditioned sensor signal can be provided outside the sensor's package.

The present invention has been described in terms of a preferred embodiment of an electronically calibrated piezoresistive pressure sensor. More particularly, the sensor of the present invention has been described to include a unique configurable analog-to-digital/digital-to-analog conversion device that minimizes circuit elements while providing the numerous analog-to-digital and digital-to-analog conversions required in the preferred implementation of sensor 100. The present invention may be easily adapted for use in other data acquisition systems requiring multiple analog-to-digital and digital-to-analog conversion operations. The described structure also includes a calibration method that applies the flexible architecture described. This approach allows manufacture of a sensor system that is silicon efficient and accurate.

What is claimed is:
1. A signal conditioning circuit comprising:
   an amplifier having an output terminal providing a signal and an input terminal for controlling a parameter of the signal;
   a comparator having a first input terminal coupled to the output terminal of the amplifier for receiving the signal, a second input terminal, and an output terminal;
   a successive approximation device operatively coupled to the output terminal of the comparator, the successive approximation device having an output bus providing digital successive approximation data;
   a memory device having another output bus providing digital parameter data; and
   a digital-to-analog converter having an analog output terminal, wherein the analog output terminal is coupled to the second input terminal of the comparator when the digital-to-analog converter is coupled to the output bus of the successive approximation device, and the analog output terminal is coupled to the input terminal of the amplifier for controlling the parameter of the signal when the digital-to-analog converter is coupled to the another output bus of the memory device.

2. A circuit in accordance with claim 1 wherein the digital successive approximation data provided by the successive approximation device is dependent on the signal output by the amplifier.

3. A circuit in accordance with claim 2 further comprising:
   a sensor having a sensor output signal operatively coupled to a signal input terminal of the amplifier, wherein the digital successive approximation data provided by the successive approximation device is dependent on the sensor output signal and the digital parameter data.

4. A signal conditioning circuit for a sensor comprising:
   a sensing element having a sensor output signal;
   a sensing element signal conditioning circuit having a signal input terminal coupled to receive the sensor output signal, an output terminal, and an analog control input terminal;
   a memory having a data structure containing a first digital correction value;
   a signal processing circuit; and
   an analog-to-digital/digital-to-analog conversion (ADC/DAC) circuit having an analog signal input terminal, a digital signal input port, an analog signal output terminal and a digital signal output port, the analog-to-digital/digital-to-analog conversion (ADC/DAC) circuit adapted:
      to receive an analog signal from the sensing element signal conditioning circuit output via the analog signal input terminal, and to provide a digital representation thereof at the digital signal output port,
      to receive a digital signal from the signal processing circuit and to provide an analog representation thereof at the analog signal output terminal, and to receive the first digital correction value from the memory and to provide an analog control signal dependent thereon to the sensing element signal conditioning circuit analog control input terminal.

5. A circuit in accordance with claim 4, wherein the analog-to-digital/digital-to-analog conversion (ADC/DAC) circuit comprises:

a digital-to-analog converter coupled between a multiplexer and a demultiplexer, an output of the demultiplexer coupled to a first input of a comparator and a second input of the comparator coupled to the sensing element signal conditioning circuit output terminal, the comparator having an output coupled to an input of a successive approximation register circuit, and an output of the successive approximation register circuit coupled to an input of the multiplexer.

6. A circuit in accordance with claim 5, wherein the analog-to-digital/digital-to-analog conversion (ADC/DAC) circuit comprises:

an input capacitor array coupled to the analog signal input terminal and a reference capacitor array coupled to the successive approximation register circuit, each of the input capacitor array and the reference capacitor array having an output coupled to the second input of the comparator.

7. A circuit in accordance with claim 5, wherein the memory is coupled to another input of the multiplexer.

8. A circuit in accordance with claim 5, wherein the analog-to-digital/digital-to-analog conversion (ADC/DAC) circuit further comprises:

a multiplexer coupled between the second input of the comparator and the sensing element signal conditioning circuit, the multiplexer further coupled to at least one other sensing element signal conditioning circuit.

9. A circuit in accordance with claim 8, wherein the data structure of the memory has another digital correction value for control of the at least one other sensing element signal conditioning circuit, and the analog-to-digital/digital-to-analog conversion (ADC/DAC) circuit is further adapted to receive the another digital correction value from the memory and to provide an analog control signal based upon the another digital correction value to a control input of the at least one other sensing element signal conditioning circuit.

10. A circuit in accordance with claim 4, wherein the analog-to-digital/digital-to-analog conversion (ADC/DAC) circuit comprises:

a digital-to-analog converter coupled between a successive approximation register and a demultiplexer, an output of the demultiplexer coupled to an input of a comparator, the comparator having a second input coupled to the output terminal of the sensing element signal conditioning circuit, an output of the comparator coupled to an input of a multiplexer and an output of the multiplexer coupled to an input of the successive approximation register.

11. A circuit in accordance with claim 10, wherein the analog-to-digital/digital-to-analog conversion (ADC/DAC) circuit comprises a serial digital data controller having an input coupled to the memory and an output coupled to a second input of the multiplexer.

12. A circuit in accordance with claim 11, wherein the analog-to-digital/digital-to-analog conversion (ADC/DAC) circuit comprises: an input capacitor array coupled between the analog signal input terminal and the comparator, and a reference capacitor array coupled between the successive approximation register and the comparator.

13. A circuit for sensing conditions comprising:

a sensing element providing an analog output signal;

a circuit for conditioning the analog output signal to provide a conditioned analog output signal responsive to an analog control signal;

a signal processing circuit operable to convert the conditioned analog output signal to a digital signal, to convert an output digital signal to an analog sensor output signal, to read a digital control value from a memory and to convert the digital control value to the analog control signal and to communicate the analog control signal to the circuit for conditioning the analog output signal; and a calculator coupled to the signal processing circuit, the calculator operable on the digital signal to provide the output digital signal.

14. A circuit in accordance with claim 13, wherein the signal processing circuit comprises a circuit for converting analog signals to digital signals.

15. A circuit in accordance with claim 14, wherein the circuit for converting analog signals to digital signals comprises a digital-to-analog converter, the digital-to-analog converter adapted to receive a plurality of inputs at least one of which is related to an analog-to-digital conversion function.

16. A circuit in accordance with claim 15, wherein at least one of the plurality of inputs comprises the digital control value.

17. A circuit in accordance with claim 14, wherein the circuit for converting analog signals to digital signals comprises a input capacitor array coupled to receive the conditioned analog output signal and a reference capacitor array coupled to the input capacitor array and a comparator.

18. A circuit in accordance with claim 14, wherein the signal processing circuit is adapted to receive output signals from a plurality of sensor element signal conditioning circuits, each of the plurality of sensor element signal conditioning circuits coupled to an output of a sensing element.

19. A circuit for processing signals comprising:

a preconditioning circuit having an analog signal input terminal, a conditioned analog signal output terminal and an analog control input terminal;

a memory containing a digital value;

a signal processing circuit; and an analog-to-digital/digital-to-analog conversion (ADC/DAC) circuit having a conditioned analog signal input, a digital signal input, an analog signal output and a digital signal output, the analog-to-digital/digital-to-analog conversion (ADC/DAC) circuit adapted:

to receive a conditioned analog signal from the conditioned analog signal output terminal and to provide a digital representation of the conditioned analog signal to the digital signal output, to receive a digital signal from the signal processing circuit and to provide an analog representation of the digital signal to the analog signal output, and to receive the digital value from the memory and to provide an analog control signal based upon the digital value to the analog control input terminal of the preconditioning circuit.

20. A circuit in accordance with claim 19, wherein the analog-to-digital/digital-to-analog conversion (ADC/DAC) circuit comprises:

a digital-to-analog converter coupled between a multiplexer and a demultiplexer, an output of the demultiplexer coupled to a first input of a comparator and a second input of the comparator coupled to the analog signal output terminal of the preconditioning circuit, the comparator having an output coupled to an input of a successive approximation register circuit, and an output of the successive approximation register circuit coupled to an input of the multiplexer.

21. A circuit in accordance with claim 20, wherein the ADC/DAC circuit comprises:
an input capacitor array coupled to the analog signal output terminal of the preconditioning circuit and a reference capacitor array coupled to the successive approximation register, each of the input capacitor array and the reference capacitor array having an output coupled to an input of the comparator.

22. A circuit in accordance with claim 20, wherein the memory is coupled to a second input of the multiplexer.

23. A circuit in accordance with claim 20, wherein the analog-to-digital/digital-to-analog conversion (ADC/DAC) circuit further comprises:
a multiplexer coupled between the second input of the comparator and the analog signal output terminal of the preconditioning circuit, the multiplexer further coupled to at least one other analog signal output terminal of at least one other preconditioning circuit.

24. A circuit in accordance with claim 20, wherein the analog-to-digital/digital-to-analog conversion (ADC/DAC) circuit comprises an offset canceling circuit.

25. A circuit in accordance with claim 19, wherein the analog-to-digital/digital-to-analog conversion (ADC/DAC) circuit comprises:
a digital-to-analog converter coupled between a successive approximation register and a demultiplexer, an output of the demultiplexer coupled to an input of a comparator, the comparator having a second input coupled to the conditioned analog signal output terminal of the preconditioning circuit, an output of the comparator coupled to an input of a multiplexer, and an output of the multiplexer coupled to an input of the successive approximation register.

26. A circuit in accordance with claim 25, wherein the analog-to-digital/digital-to-analog conversion (ADC/DAC) circuit comprises a serial digital data controller having an input coupled to the memory and an output coupled to a second input of the multiplexer.

27. A circuit in accordance with claim 25, wherein the analog-to-digital/digital-to-analog conversion (ADC/DAC) circuit comprises:
an input capacitor array coupled to the analog signal output terminal of the preconditioning circuit and a reference capacitor array coupled to the successive approximation register, each of the input capacitor array and the reference capacitor array having an output coupled to an input of the comparator.

28. A method for conditioning a signal including an analog signal conditioning circuit with an analog signal input terminal, a parameter control input terminal, and an analog signal output terminal, a comparator with a first input terminal coupled to the analog signal output terminal of the analog signal conditioning circuit, a second input terminal and an output terminal, a successive approximation device coupled to the output terminal of the comparator, the successive approximation device having an output port, a memory device for holding a digital correction value, and a digital-to-analog converter having an analog output terminal, the method comprising the steps of:
coupling the analog output terminal of the digital-to-analog converter to the parameter control input terminal of the analog signal conditioning circuit, and feeding the digital correction value from the memory device through the digital-to-analog converter to the parameter control input terminal of the analog signal conditioning circuit; and
coupling the analog output terminal of the digital-to-analog converter to the second input terminal of the comparator and converting an analog output signal from the analog signal output terminal of the analog signal conditioning circuit to a digital output signal dependent on the digital correction value.

29. A method in accordance with claim 28 further comprising the steps of:
interpreting the digital output signal and providing another digital correction value dependent thereon; and
coupling the analog output terminal of the digital-to-analog converter to the second input terminal of the comparator and converting an analog output signal from the analog signal output terminal of the analog signal conditioning circuit to a corrected digital output signal dependent on the digital correction value.

30. A method for trimming a sensor that produces a signal when the sensor is measuring a physical quantity, the method implemented on a device including an analog signal conditioning circuit with an analog signal input terminal coupled to and receiving the signal from the sensor, a parameter control input terminal, and an analog signal output terminal, a comparator with a first input terminal coupled to the analog signal output terminal of the analog signal conditioning circuit, a second input terminal and an output terminal, a successive approximation device coupled to the output terminal of the comparator, the successive approximation device having an output port, a memory device for providing digital correction values, and a digital-to-analog converter having an analog output terminal, the method comprising the steps of:
subjecting the sensor to a first physical condition;
coupling the analog output of the digital-to-analog converter to the parameter control input terminal of the analog signal conditioning circuit, and feeding a first digital correction value of the digital correction values from the memory device through the digital-to-analog converter to the parameter control input terminal of the analog signal conditioning circuit;
coupling the analog output terminal of the digital-to-analog converter to the second input terminal of the comparator and converting an analog output signal from the analog signal output terminal of the analog signal conditioning circuit to a first digital output signal dependent on the first digital correction value;
subjecting the sensor to a second physical condition;
coupling the analog output terminal of the digital-to-analog converter to the second input terminal of the comparator and converting a second analog output signal from the analog signal output terminal of the analog signal conditioning circuit to a second digital output signal dependent on the first digital correction value;
analyzing the first digital output signal and the second digital output signal, and providing a second digital correction value dependent thereon; and
coupling the analog output terminal of the digital-to-analog converter to the parameter control input terminal of the analog signal conditioning circuit, and feeding the second digital correction value of the digital correction values from the memory device through the digital-to-analog converter to the parameter control input terminal of the analog signal conditioning circuit.

31. A method in accordance with claim 30 wherein the step of subjecting the sensor to a first physical condition comprises a step of subjecting the sensor to a first temperature.

32. A method in accordance with claim 31 wherein the step of subjecting the sensor to a second physical condition comprises a step of subjecting the sensor to a second temperature.

33. A method in accordance with claim 32 further comprising a step of:

subjecting the sensor to a constant pressure while subjecting the sensor to the first temperature and subjecting the sensor to the second temperature.

34. A method in accordance with claim 30 further comprising the step of:

coupling the analog output terminal of the digital-to-analog converter to the second input terminal of the comparator and converting a third analog output signal from the analog signal output terminal of the analog signal conditioning circuit to a third digital output signal dependent on the second digital correction value.

* * * * *